United States Patent [19]

Kwon et al.

[11] Patent Number: 5,665,635
[45] Date of Patent: Sep. 9, 1997

[54] METHOD FOR FORMING FIELD OXIDE FILM IN SEMICONDUCTOR DEVICE

[75] Inventors: Sung Ku Kwon; Seung Moo Lee, both of Kyoungki-do, Rep. of Korea

[73] Assignee: Hyundai Electronics Industries Co., Ltd., Kyoungki-do, Rep. of Korea

[21] Appl. No.: 749,024

[22] Filed: Nov. 14, 1996

[30] Foreign Application Priority Data

Nov. 30, 1995 [KR] Rep. of Korea ............ 95-45481

[51] Int. Cl.⁶ ............................................. H01L 21/76
[52] U.S. Cl. ..................... 438/427; 438/699; 438/437
[58] Field of Search ............... 437/67, 72, 228 ST, 437/228 TR, 946; 148/DIG. 50

[56] References Cited

U.S. PATENT DOCUMENTS

| | | | |
|---|---|---|---|
| 5,094,972 | 3/1992 | Pierce et al. | 437/67 |
| 5,308,786 | 5/1994 | Lur et al. | 437/67 |
| 5,354,387 | 10/1994 | Lee et al. | 148/33.3 |
| 5,492,858 | 2/1996 | Bose et al. | 437/67 |

*Primary Examiner*—Trung Dang
*Attorney, Agent, or Firm*—Gary M. Nath; Nath & Associates

[57] ABSTRACT

A method for forming field oxide films in a semiconductor device, characterized by treating a trench mask and a trench oxide to make their surfaces positively charged so that an ozone-TEOS USG film might be deposited at a rapid rate on the trench oxide but at slow rate on the trench mask, whereby production yield can be significantly improved.

17 Claims, 8 Drawing Sheets

METHOD FOR FORMING FIELD OXIDE FILM IN SEMICONDUCTOR DEVICE

BACKGROUND OF THE INVENTION

1. Field of the Invention

The present invention relates, in general, to a method for forming field oxide films in a semiconductor device and, more particularly, to a method for forming field oxide films free of global step, which is the step between a cell region and a peripheral circuit region.

2. Description of the Prior Art

To create a field oxide film, a LOCOS (Local oxidation of silicon) process in which an inactive region of a semiconductor substrate is selectively exposed and oxidized to grow an oxide has generally been used. A significant problem with the LOCOS process is that the field oxide grown on the inside and the outside of the exposed semiconductor substrate invades active regions of the semiconductor substrate as well as causing a step on the semiconductor substrate. Consequently, such invasion requires more active regions, leading to a decrease in the degree of integration and the step attributed to the protrusion of the field oxide film. This characteristic creates significant difficulty in subsequent processes.

To solve the problems of the LOCOS process, trench processes in which field oxide films are grown in a trench which is formed by etching a semiconductor substrate to a certain depth have recently been proposed. In detail, first, a mask is formed which locally exposes the semiconductor substrate using a LOCOS process. Also, the exposed semiconductor substrate is etched to a certain depth, so as to form narrow trenches in cell regions and wide trenches in peripheral circuit regions. After removal of the mask layer, a blanket of an oxide film is deposited over the resulting structure, to fill the trenches. Then, dummy patterns are, in part, formed over the peripheral circuit regions to take off the thick oxide film on the cell regions. Thereafter, a photosensitive film or SOG (Spin On Glass) film is formed for planarization and then, subjected to etch back so that the oxide film remains only in the trenches.

As described above, this trench technique requires additional steps of forming dummy patterns and a planarization layer, and etching back the planarization layer, the dummy patterns and the highly stepped oxide film. Thus, this technique is complicated and difficult to control.

There is another prior art for forming a field oxide film. According to this art, a trench type field oxide film is formed in a cell region while forming another film in a peripheral circuit region by use of the LOCOS process. However, the division into cell region and peripheral circuit region puts this art in a fetter of complication.

It is obvious that complicated processes deteriorate the properties and production yield of the semiconductor device.

In order to better understand the background of the present invention, the conventional techniques will be described below, in connection with some drawings.

Referring to FIGS. 1A to 1C, a conventional method for forming a field oxide film of a semiconductor device is illustrated.

First, as shown in FIG. 1A, a pad oxide film 33 with a certain thickness is formed over a semiconductor substrate 31 by a thermal oxidation process, after which an element-isolating mask is used to form a nitride pattern (not shown) which, in turn, serves as a mask in etching the pad oxide film 33 and a semiconductor substrate 31 to form a narrow trench 35 and a wide trench 36. A blanket of an oxide film 37 is deposited over the resulting structure in a chemical vapor deposition (hereinafter referred to as "CVD") process. By reference, because the narrow trench 35 is formed in a cell region 300, the oxide film 37 can cover the cell region 300 even after filling the narrow trench 35. In contrast, in a peripheral circuit region, the oxide film merely fills the wide trench 36. As a consequence, a step between the upper surface of the oxide film 37 on the cell region 300 and that on the peripheral circuit region 400 occurs.

Next, another oxide film is deposited entirely over the oxide film 37 and patterned to create a dummy pattern only on the peripheral circuit region 400. The upper surface of the dummy pattern 38 is on the same level as that of the oxide film 37 of the cell region 300. Following this, a planarization layer 39 is formed with SOG or BPSG (borophospho silicate glass) to planarize the overall surface.

FIG. 1C is a cross section after the planarization layer 39, the dummy pattern 38 and the oxide film 37 all are etched until the pad oxide film 33 is exposed. As a result, field oxide films 40 are created which fill the trenches 35 and 36.

Referring to FIG. 2, there is another conventional method for forming field oxide films of a semiconductor device.

According to this method, a pad oxide film 43 is first formed on a semiconductor substrate 41, followed by the formation of a field oxide film 45 in a LOCOS process using a mask through which an inactive region of a peripheral circuit region 600 is exposed, as shown in FIG. 2A. Then, using a mask through which an inactive region of a cell region 500 is exposed, the pad oxide film 43 and the semiconductor substrate 41 are both etched to form a trench 47, followed by the deposition of a blanket of an oxide film 49 over the resulting structure. For this deposition, a CVD process is carried out.

Subsequently, until the pad oxide film 43 is exposed, the oxide film 49 is etched to form a trench-type field oxide film in the cell region 500 and a LOCOS-type field oxide film in the peripheral circuit region 600.

As mentioned above, these two illustrative conventional methods are complicated.

SUMMARY OF THE INVENTION

Therefore, it is an objective of the present invention to overcome the above problems encountered in prior arts and to provide a simple method for forming field oxide films in a semiconductor device, by which an insulating film can fill a narrow trench and a wide trench simultaneously while its upper surface is flat.

It is another objective of the present invention to provide a method for forming field oxide films in a semiconductor device, by which insulating film filling the trenches can be improved in insulating properties.

The main characteristic of the present invention resides in utilizing the difference in the deposition rate of a particular insulating film on the trench mask and trench which are both surface treated, thereby filling the wide trench and the narrow trench as well as obtaining a flat insulating surface.

The present invention is also characterized in making it dense and fine through thermal treatment the insulating film deposited on the trench.

In accordance with the present invention, the above objectives could be accomplished by a provision of a method for forming field oxide films in a semiconductor device, comprising the steps of: forming a first insulating film on a semiconductor substrate; forming a second insulating film on the first insulating film, said second insulating film being different from said first insulating film in material; etching the second insulating film, the first insulating film and the semiconductor substrate, in sequence, within element-isolating regions, to form a narrow trench and a wide trench; forming a third insulating film on the surfaces of the trenches through thermal oxidation; surface-treating the exposed surfaces of the third and the second insulating films in such a way that a subsequent insulating film might be deposited at rapid rate on the third insulating film but at slow rate on the second insulating film; depositing a blanket of a fourth insulating film over the resulting structure until the upper surface of the fourth becomes flat at a level higher than the height of the second insulating film; thermally treating the fourth insulating film to make it fine and dense; subjecting the fourth insulating film to etch back; and removing the second insulating film so as to create an element-isolating film structure in which the trenches are filled with the fourth insulating film.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Figure 1A:
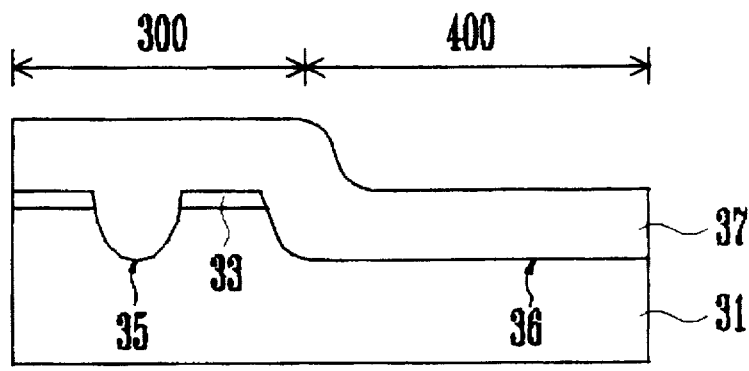
FIGS. 1A through 1C are schematic cross sectional views showing a conventional method for forming field oxide films in a semiconductor device.
Figure 1B:
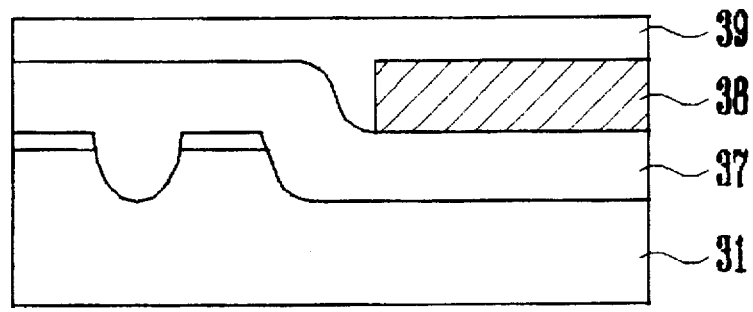
Figure 1C:
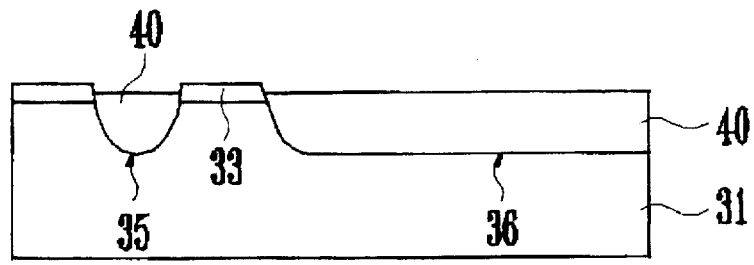
Figure 2A:
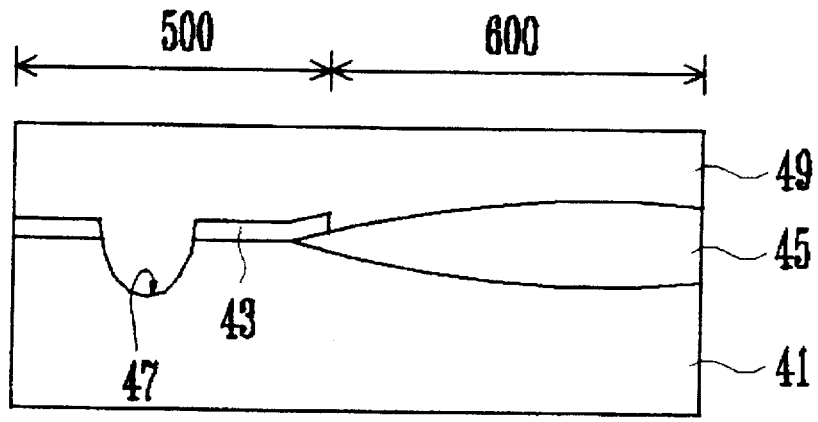
FIGS. 2A and 2B are schematic cross sectional views showing another conventional method for forming field oxide films in a semiconductor device.
Figure 2B:
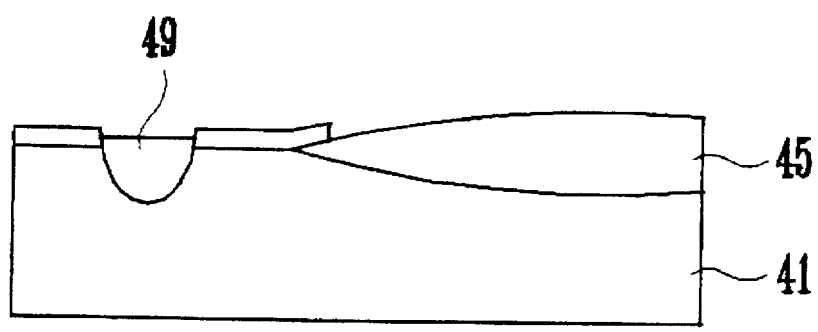

The application of the preferred embodiments of the present invention is best understood with reference to the accompanying drawings, wherein like reference numerals are used for like and corresponding parts, respectively.

Referring to FIGS. 3 through 7, a method for forming field oxide films of a semiconductor device, according to the present invention is illustrated.

Figure 3:
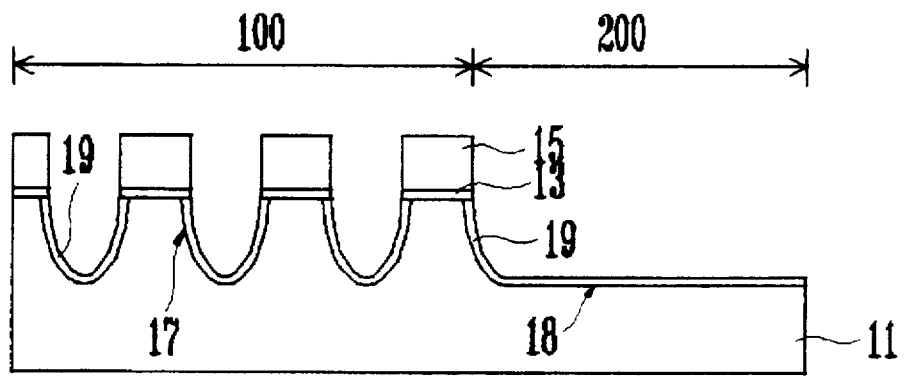
FIGS. 3 through 7 are schematic cross sectional views showing a novel method for forming field oxide films in a semiconductor device, according to the present invention.
Figure 4:
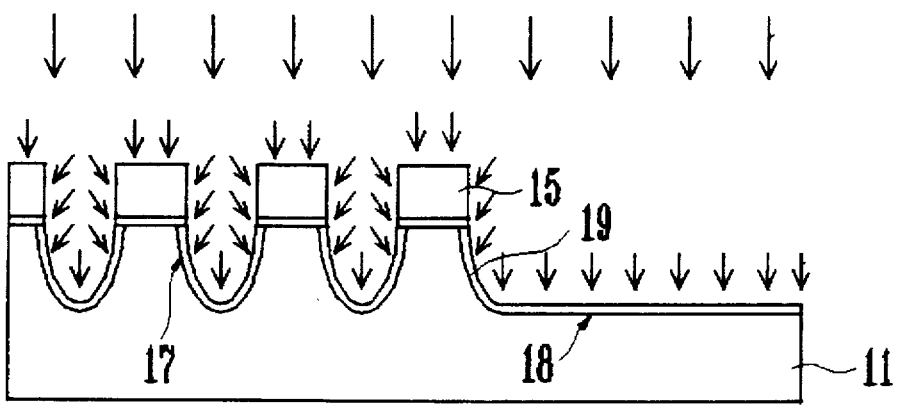

Initially, as shown in FIG. 3, a first insulating film 13 is formed on a semiconductor substrate 11, followed by the deposition of a second insulating film 15 over the first insulating film 13. The first insulating film 13 will serve as a pad oxide film and is 30–300 Å thick. Its formation is achieved using a thermal oxidation process. The second insulating film 15 is formed of a nitride and in a CVD process and has a thickness of 500–3,000 Å. Then, using an element-isolating mask (not shown), an etching process is carried out to form narrow trenches 17 in a cell region 100 of the semiconductor substrate 11 and a wide trench 18 in a peripheral circuit region 200. The trenches 17 and 18 have a depth ranging form 500 to 6,000 Å. Thereafter, a third insulating film 19 is formed of an oxide over the surfaces of the trenches 17 and 18. As in the first insulating film 13, a thermal oxidation process is executed at 750°–1,100° C. to form the oxide film 19 at a thickness of 30–1,000 Å. This oxide film 19 plays a critical role in securing the interface properties of the trench type field oxide film to be formed in addition to being preventive of the damage to the semiconductor substrate 11 which may be generated upon a subsequent surface treatment process.

Next, a surface treatment process is carried out in such a manner that the oxide film 19 formed over the nitride film 13 and the trenches has a positive potential at its surface. This positive potential allows an insulating film, for example, ozone-TEOS film to be deposited at a slow rate over the nitride film 13 but at a high rate over the oxide film 19.

The surface treatment may be performed in four ways in accordance with the present invention.

As a first example, plasma comprising nitrogen and ammonia ($NH_3$) is used. The surface treatment of the oxide film 19 with the plasma is carried out with plasma enhanced chemical vapor deposition (PECVD) equipment in which 4–10 liters of ammonia per 1–3 liter of nitrogen are provided at a temperature 350°–450° C. and a pressure of 1–3 Torr for 10–60 sec. During the surface treatment, the equipment generates dual high (above 13.56 MHz)/low (below 13.56 MHz) frequencies of a power ranging from 0.5–1 KW and 0.2–1 KW, respectively.

A second example of the surface treatment is to use plasma comprising argon. In a sputtering equipment, 10–50 sccm of argon is provided at room temperature under a pressure of 20–50 mTorr using high/low frequencies of a power ranging from 300–500 W and 100–200 W respectively.

Another surface treatment may be performed by a wet washing process. For example, the oxide film 19 is dipped in a trimethyl ammonium hydroxide solution for 30–60 sec.

Alternatively, the surface of the oxide film 19 and the nitride film 13 may be treated by spraying a $CO_2$-bubbled solution in deionized water onto a rotating wafer for 10–30 sec.

Figure 5:
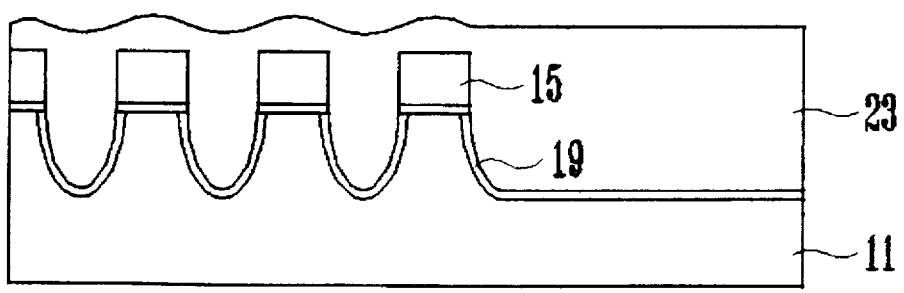

FIG. 5 is a cross section taken after a blanket of a fourth insulating film 23, for example, ozone-TEOS USG film, is deposited over the resulting structure. Owing to the surface treatment, the ozone-TEOS USG film 23 is formed at a slow rate on the nitride film 13, and at a rapid rate on the oxide film 19. Using ozone/TEOS in a ratio of 10–20, the ozone-TEOS USG film 23 is formed with a thickness of 5,000–20,000 Å at a temperature of 380°–450° C. Because the deposition rate of the ozone-TEOS USG film is twice as high on the oxide film 19 of the trenches as on the nitride film 19, a flat surface of the ozone-TEOS film can be obtained after a certain amount of time elapses.

Figure 6:
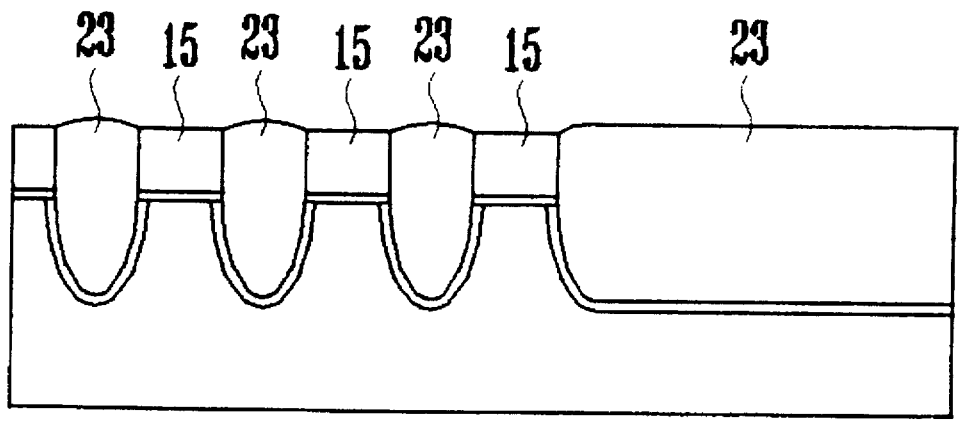
Figure 7:
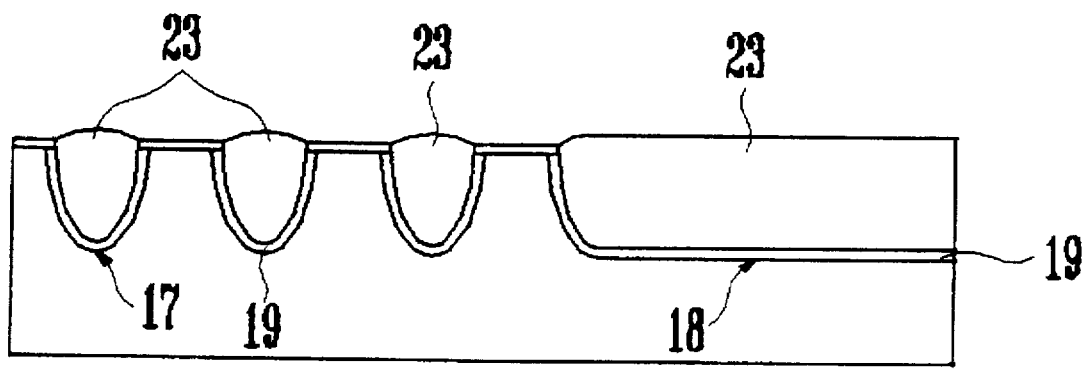

Next, a thermal treatment is executed to make the deposited ozone-TEOS USG film 23 dense and fine, after which the ozone-TEOS USG film 23 is subjected to etch back, as shown in FIG. 6. Absence of thermal treatment leads to a deterioration of the insulating properties of the ozone-TEOS USG film 23 because it contains much moisture. The thermal treatment is carried out at 900°–1,100° C. for 10–60 min and, for the etch back, a wet or dry etch back or chemical mechanical polishing (CMP) process may be utilized. Of the ozone-TEOS USG film 23, the part over the nitride film 15 is more rapidly etched than other parts because it is more porous.

Finally, the exposed nitride film 15 and a predetermined thickness of the ozone-TEOS USG film 23 are both removed in a wet etch process to create trench type field oxide film structure in which the trench 17 of the cell region 100 and the trench 18 of the peripheral circuit region 200 are filled with the oxide film 19 and the ozone-TEOS USG film 23. The wet etch process may use hot $H_3PO_4$.

Turning to FIGS. 8 through 13, there are analysis results of the ozone-TEOS USG film.

Figure 8:
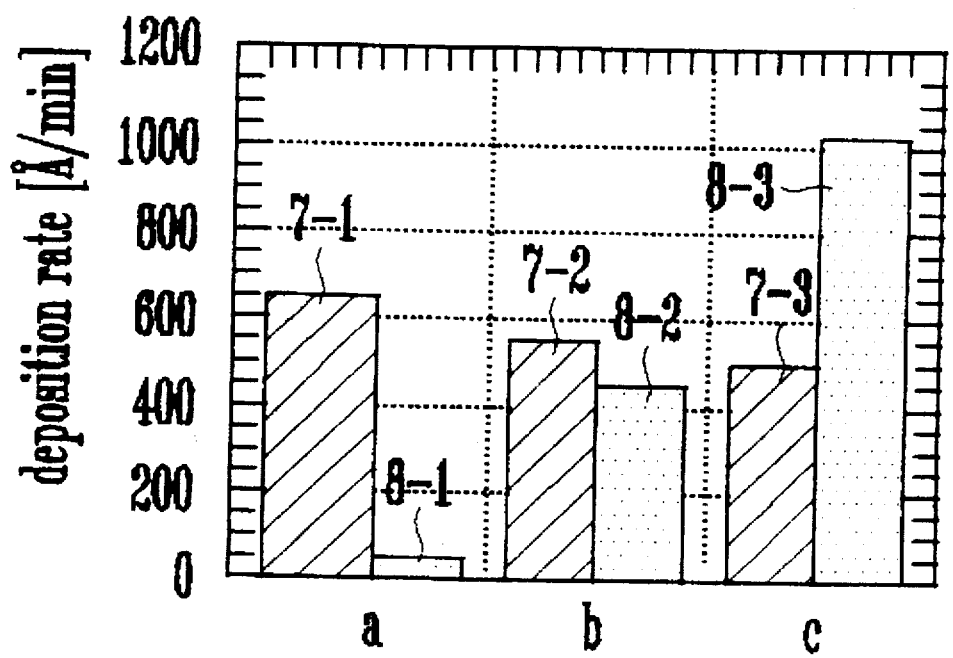
FIGS. 8 through 13 are graphs showing the analysis results of an ozone-TEOS USG film useful in the invention.

FIG. 8 shows the deposition rate of ozone-TEOS USG film on nitride and oxide. Reference numerals "7-1", "7-2" and "7-3" stand for the deposition rates at which ozone-TEOS USG film is deposited on nitride whereas reference numerals "8-1", "8-2" and "8-3" represent the deposition rates on oxide.

In this graph, "a" panel is the case in which an ozone-TEOS USG film is deposited on nitride and oxide which have not been surface-treated. In this case, the ozone-TEOS USG film is more rapidly deposited on the nitride rather than the oxide, generating the so-called over-hang phenomenon, which causes voids in the narrow trench.

The panel designated by reference character "b" show the case in which, subsequent to the process of FIG. 3, an oxide film is deposited to a certain thickness in a PECVD process, followed by the deposition of an ozone-TEOS USG film over the oxide film. As seen, "7-2" and "8-2" are similar to each other in the deposition rate. Thus, the same problem as that of the "a" panel is generated.

The panel "c" shows the deposition rates when an ozone-TEOS USG film is deposited on the nitride and oxide which have both been treated with nitrogen plasma in accordance with the present invention. As seen, the deposition rate on the oxide "8-3" is twice as fast as that on the nitride "7-3". In this case no step is generated.

Figure 9:
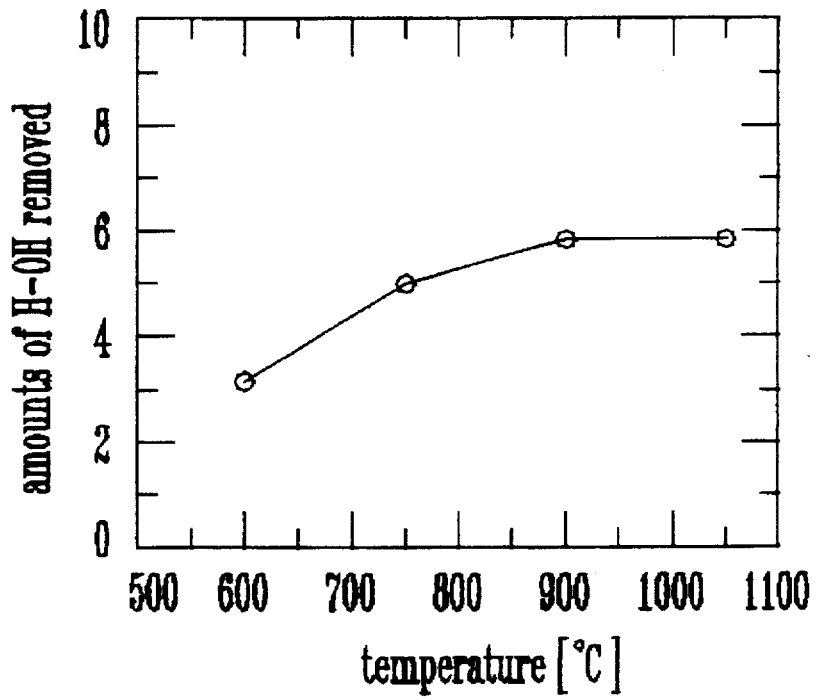
Figure 10:
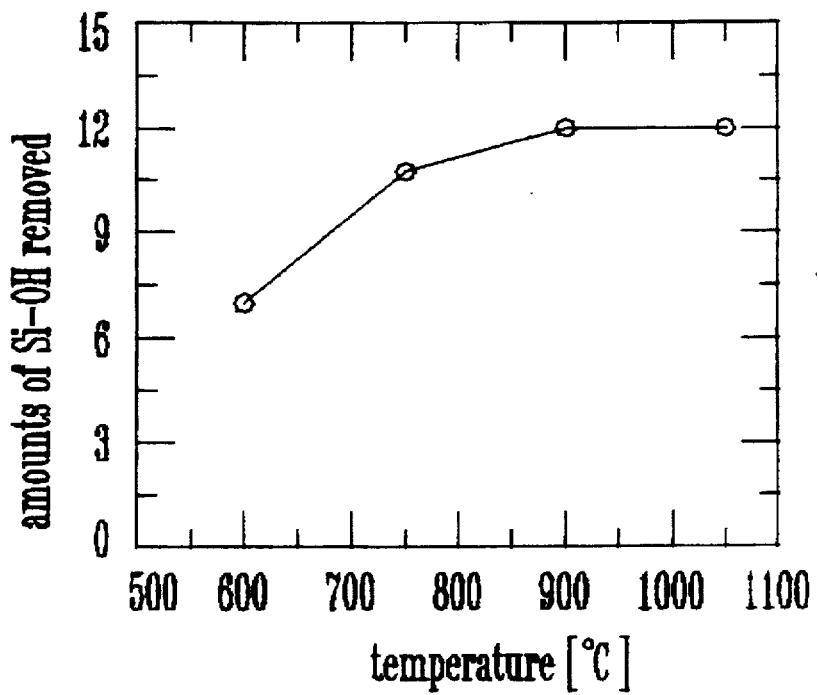

In FIGS. 9 and 10, the amounts of H—OH and Si—OH removed when a thermal treatment is applied for the ozone-TEOS USG film in order to make the film dense and fine, are plotted with regard to the treatment temperature. As mentioned above, this thermal treatment is important in preventing the film from absorbing or releasing moisture. As shown in these plots, the removal of H—OH and Si—OH is most effective at about 900° C. and the amounts removed remain unchanged even at more than 900° C. Thus, it is efficient that the thermal treatment is carried out at a temperature of 900°–1,000° C.

Figure 11:
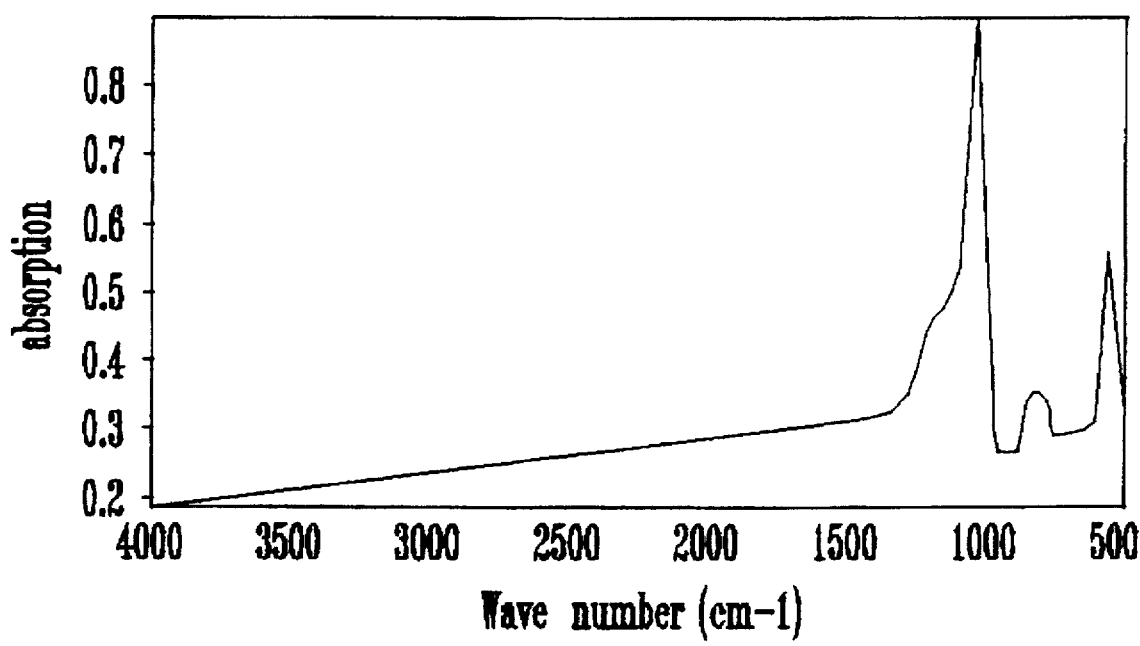
Figure 12:
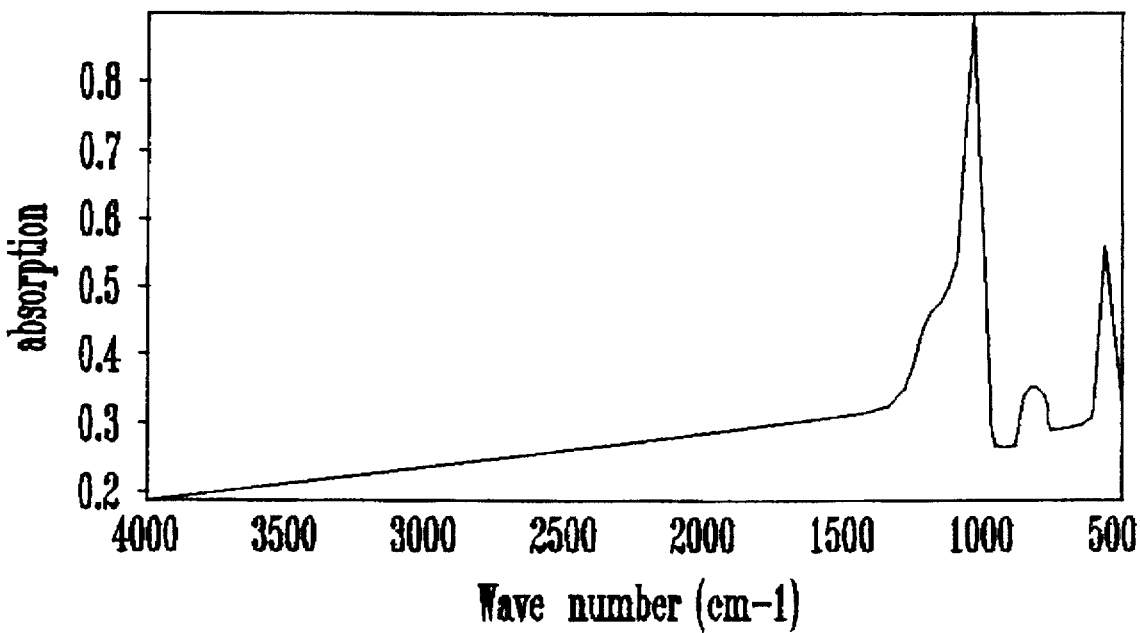

Based on Fourier transform infrared analysis, the changes of absorption coefficient with frequency in ozone-TEOS USG films are depicted in FIGS. 11 and 12. Just after being thermally treated, the ozone-TEOS USG film is used for the analysis which is shown in FIG. 11. For the analysis of FIG. 12, the ozone-TEOS USG film is thermally treated and allowed to stand for 167 hrs in the atmosphere. As is apparent from the data, the absorption coefficients between the two cases are almost the same, demonstrating that the ozone-TEOS USG film can be made fine and dense and deprived of most moisture (H—OH, Si—OH) by one round of the thermal treatment, so that it is not significantly affected by subsequent processes and can maintain reliability for a long time.

Figure 13:
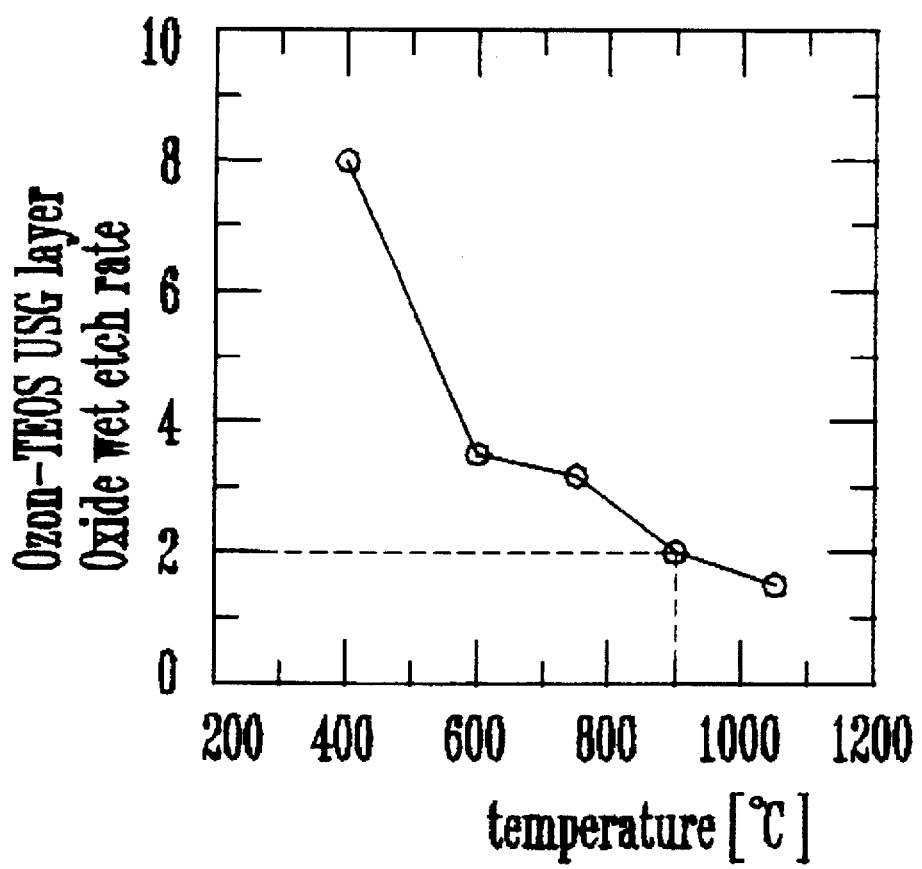

FIG. 13 is a graph in which the wet etch ratios of the ozone-TEOS USG film to the oxide film formed by thermal oxidation film are plotted with regard to the temperatures of the thermal surface treatment when the films are etched with a HF solution of 50:1. At 900° C. or higher, the thermal treatment temperatures, the wet etch ratio of the ozone-TEOS USG film to the oxide film is below about 2:1. That is, the fine and dense ozone-TEOS USG film can be used as a etch barrier layer when removing the nitride film and thus, is suitable for the trench type field oxide film.

As described hereinafter, the method for forming field oxide films of a semiconductor device according to the present invention is characterized in utilizing the difference in the deposition rate of a particular insulating film on the nitride and oxide which are both surface treated, thereby filling the wide trench and the narrow trench as well as obtaining a flat insulating surface. Thus, production yield can be significantly improved. In addition, the thermal treatment deprives moisture of the ozone-TEOS USG film which makes it more fine and dense and thus, useful as a field oxide film. Further, using this fine and dense ozone-TEOS USG film as an etch barrier, the nitride can be readily removed.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for forming field oxide films in a semiconductor device, comprising the steps of:

forming a first insulating film on a semiconductor substrate;

forming a second insulating film on the first insulating film, said second insulating film being different from said first insulating film in material;

etching the second insulating film, the first insulating film and the semiconductor substrate, in sequence, within element-isolating regions, to form a narrow trench and a wide trench;

forming a third insulating film on the surfaces of the trenches through thermal oxidation;

surface-treating the exposed surfaces of the third and the second insulating films in such a way that a subsequent insulating film might be deposited at rapid rate on the third insulating film but at slow rate on the second insulating film;

depositing a blanket of a fourth insulating film over the resulting structure until the upper surface of the fourth becomes flat at a level higher than the height of the second insulating film;

thermally treating the fourth insulating film to make it fine and dense;

subjecting the fourth insulating film to etch back; and removing the second insulating film so as to create an element-isolating film structure in which the trenches are filled with the fourth insulating film.

2. A method in accordance with claim 1, wherein said first insulating film is a pad oxide film with a thickness of 30–300 Å.

3. A method in accordance with claim 1, wherein said second insulating film is 500–3,000 Å thick and is formed of a nitride in a chemical vapor depositing process.

4. A method in accordance with claim 1, wherein said narrow trench and said wide trench are formed in a cell region and a peripheral circuit region, respectively, both trenches having a depth of 500–6,000 Å.

5. A method in accordance with claim 1, wherein said third insulating film is a thermal oxide grown at 750°–1,100° C. into a thickness of 30–1,000 Å.

6. A method in accordance with claim 1, wherein the surface treatment of said third and second insulating films is carried out using a plasma comprising nitrogen and ammonia.

7. A method in accordance with claim 6, wherein said plasma is generated in a plasma enhanced chemical vapor depositing equipment in which 4–10 liters of ammonia is provided per 1–3 liters of nitrogen at a pressure of 1–3 Torr and at a temperature of 350°–450° C.

8. A method in accordance with claim 1, wherein said surface-treating step is performed with a plasma using argon.

9. A method in accordance with claim 8, wherein said plasma is generated in a sputtering equipment in which argon is provided at a flow rate of 10–50 sccm at room temperature under a pressure of 20–50 mTorr.

10. A method in accordance with claim 1, wherein said surface-treating step is carried out in a wet washing process.

11. A method in accordance with claim 10, wherein said wet washing process comprises dipping said exposed surface of the third and second insulating films in a trimethyl ammonium hydroxide solution for 30–60 sec at room temperature.

12. A method in accordance with claim 10, wherein said wet washing process comprises spraying the semiconductor substrate with a $CO_2$ bubbled solution in deionized water.

13. A method in accordance with claim 10, wherein said fourth insulating film is an ozone-TEOS film which is deposited in a chemical vapor depositing process using the reaction of ozone with TEOS.

14. A method in accordance with claim 13, wherein said ozone-TEOS film is deposited using ozone and TEOS at a ratio of 10–20.

15. A method in accordance with claim 14, wherein said ozone-TEOS is formed with a thickness of 5,000–20,000 Å at a temperature of 380°–450° C.

16. A method in accordance with claim 1, wherein said thermally treating step is carried out at a temperature of 900°–1,000° C.

17. A method in accordance with claim 1, wherein said etch back is performed in a wet process, a dry process or a chemical mechanical polishing process.

* * * * *